US006233168B1

(12) United States Patent
Kokubun et al.

(10) Patent No.: US 6,233,168 B1
(45) **Date of Patent: *May 15, 2001**

(54) NON-VOLATILE SEMICONDUCTOR MEMORY CAPABLE OF REDUCING PARASITIC CURRENT

(75) Inventors: Hitoshi Kokubun; Shooji Kitazawa; Keiichiro Takeda; Yuichi Ashizawa, all of Tokyo (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 56 days.

(21) Appl. No.: 09/371,834

(22) Filed: Aug. 11, 1999

(30) Foreign Application Priority Data

Aug. 13, 1998 (JP) ........................................ 10-228972

(51) Int. Cl.[7] ........................................ G11C 17/00

(52) U.S. Cl. ........................................ 365/104; 365/226

(58) Field of Search ........................................ 365/104, 226, 365/185.03, 185.05, 185.21, 230.03, 185.11

(56) References Cited

U.S. PATENT DOCUMENTS 5,132,933 * 7/1992 Schreck et al. ...................... 365/104

FOREIGN PATENT DOCUMENTS 2-210694 8/1990 (JP) .

* cited by examiner

*Primary Examiner*—David Nelms
*Assistant Examiner*—David Lam
(74) *Attorney, Agent, or Firm*—Jones Volentine, LLC

(57) ABSTRACT

A non-volatile semiconductor memory decreases a parasitic current as much as possible without using an electric separation means. This nonvolatile semiconductor storage apparatus has multiple memory cells rows having multiple memory cell transistors M1, M2 . . . whose gates are connected to word lines WL1, WL2 . . . , respectively, and whose sources and drains are serially connected. This nonvolatile semiconductor storage apparatus also has multiple column lines SBL0, SVL0, SVL1, SBL1 . . . which connect the connection nodes between the sources and drains of the memory cell transistors M1, M2 . . . in the column direction, a power source line PV1 which supplies a prescribed electric potential to these column lines, first and second sense amplifiers which detect the electric potential level of the column lines or a current that flows through the column lines, sense column line selection means SS2, SS3, SS02, SS03, and 100 which connect column lines SBL3 and SBL5 connected to one terminal of selected memory cell M6 and one terminal of selected memory cell M11, respectively, to the first and second sense amplifiers A0 and A1, respectively. In this case, the memory cell M6 is separated from the memory cell M11 by a prescribed number of memory cells on the same memory cell row. This nonvolatile semiconductor storage apparatus further has power source supply column line selection means DS0, DS1, DS00, DS01 . . . which connect the column lines connected to the other terminals of the two selected memory cells to the power source line.

20 Claims, 7 Drawing Sheets

NON-VOLATILE SEMICONDUCTOR MEMORY CAPABLE OF REDUCING PARASITIC CURRENT

BACKGROUND OF THE INVENTION

The present invention relates to non-volatile semiconductor memory, more particularly to arrangement structures of a memory matrix for which a contrived method for reading data from the non-volatile semiconductor storage apparatuses is provided.

In a semiconductor storage apparatus, memory cells that can be set to three or more storage states are called multi-valued cells. For example, in a memory cell transistor, a multi-valued cell capable of storing 2-bit information by making it possible to set four values of current requires only half the cell area compared with a standard memory cell capable of storing 1-bit information. Such a multi-valued cell has an advantage in cost. However, since a multi-valued cell has several storage states, the gap between characteristic values in each state is smaller compared with the standard memory cell. Therefore, variations in the finished dimensions of the manufactured memory cells cause a high defective rate for the memory cells.

For this reason, in determining the arrangement structure of a multi-valued cell, it is important to apply a voltage to each terminal of a selected memory cell independently of the position of the selected memory cell within the arrangement. It is also desirable that the amount of parasitic current, which a sense amplifier detects, be made as small as possible. Here, the parasitic current is a current that depends on the data stored in adjacent cells other than the selected cell.

The arrangement structure of a multi-valued cell that avoids a parasitic current is disclosed in the Japanese Patent Application Laid-Open No. H6-318683. According to this arrangement structure, memory cells arranged in the column direction are divided into groups of eight memory cells which are electrically separated from each other. These eight memory cells which are electrically separated from each other are connected to main bit lines and main ground lines only when these eight memory cells are selected. When these eight memory cells are not selected, these electrically separated eight memory cells are electrically separated from the main bit lines and main ground lines, and are put in a floating state.

However, when a memory cell column is electrically separated for every eight cells, the area of the memory cell arrangement is increased. For example, when an electric separation means is constructed having an area equal to the area of one memory cell, the area of the resultant memory arrangement is increased by 12.5%. In addition, since unselected main bit lines and unselected main ground lines are put in a floating state, the access time is delayed, which is a problem.

SUMMARY OF THE INVENTION

Given these problems, it is an object of the present invention to provide a non-volatile semiconductor storage apparatus capable of reducing the amount of parasitic current as much as possible without using an electric separation means. It is also an object of the present invention to provide a non-volatile semiconductor storage apparatus which prevents unselected memory cells on selected row lines from being connected to selected column lines to the greatest extent.

According to the present invention, this non-volatile semiconductor storage apparatus has multiple memory cells rows having multiple memory cell transistors whose gates are connected to word lines, respectively, and whose sources and drains are serially connected. This non-volatile semiconductor storage apparatus also has multiple column lines which connect the connection nodes between the sources and drains of the memory cell transistors in the column direction, a power source line which supplies a prescribed electric potential to these column lines, first and second sense amplifiers which detect the electric potential level of the column lines or a current that flows through the column lines, sense column line selection means which connect column lines connected to one terminal of one selected memory cell and one terminal of the other selected memory cell, respectively, to the first and second sense amplifiers, respectively. In this case, the one memory cell is separated from the other memory cell by a prescribed number of memory cells on the same memory cell row. This nonvolatile semiconductor storage apparatus further has power source supply column line selection means which connect the column lines connected to the other terminals of the two selected memory cells to the power source line.

It is desirable that the value of resistance of a wire path between the selected memory cell governed by the sense column line selection means and the first or second sense amplifier be smaller than the values of resistance of the prescribed number of memory cells.

DETAILED DESCRIPTION OF THE PREFERRED EMBODIMENTS

Figure 1:
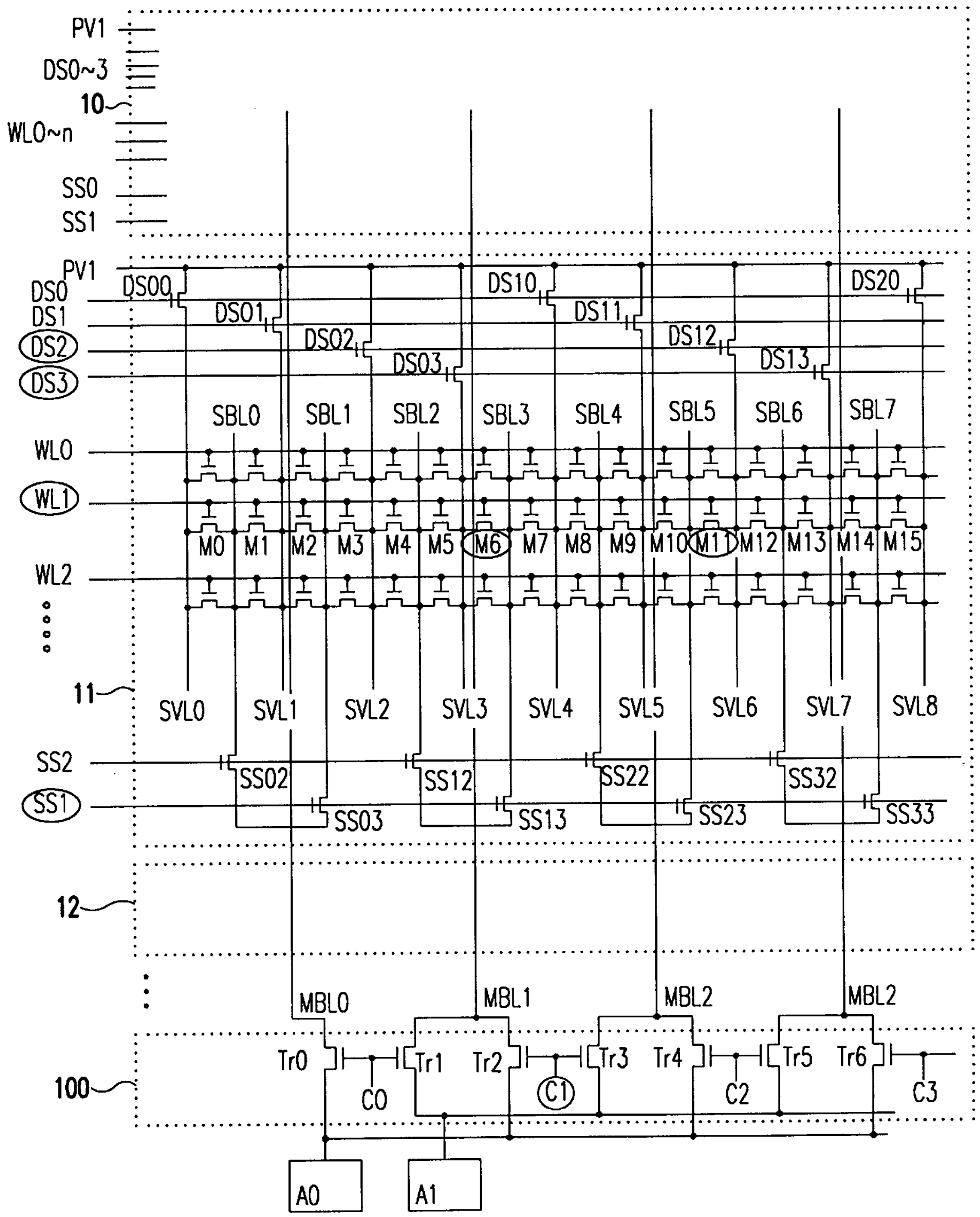
FIG. 1 is a circuit diagram showing a non-volatile semiconductor storage apparatus according to the first embodiment of the present invention.

FIG. 1 is a circuit diagram showing a non-volatile semiconductor storage apparatus according to the first embodiment of the present invention. The multiple memory cells M0, M1, M2 . . . of the multi-valued mask ROM are N-type MOS transistors. As shown in FIG. 1, the sources of these transistors are serially connected and the drains of these transistors are also serially connected. The gates of these transistors are connected to common word lines WL0, WL1, WL2 . . . and form memory cell rows. Column lines are formed by connecting the coupling nodes of the sources and drains of the transistors so that they are orthogonal to the memory cell rows as shown in FIG. 1. The column lines are composed of sub power source lines SVL0, SVL1, SVL2 . . . and sub bit lines SBL0, SBL1, SBL2 . . . The sub power source lines SVL0, SVL1, SVL2 . . . and sub bit lines SBL0, SBL1, SBL2 . . . are installed alternately. Multiple rows of memory cells form one segment 11. Multiple segments 10, 11, 12 . . . are connected with multiple main bit lines to form a memory matrix. The word lines WL0, WL1, WL2 . . . of the segments 10, 11, 12 . . . , respectively, are commonly connected. Of the sub bit lines SBL0, SBL1, SBL2 . . . that are installed alternately with the sub power source lines, even numbered sub bit lines SBL0, SBL2, SBL4 . . . are connected to main bit lines MBL1, MBL2 . . . , via source selection transistors SS02, SS12, SS22 . . . , respectively. Similarly, odd numbered sub bit lines SBL1, SBL3, SBL5 . . . are connected to main bit lines MBL0, MBL1, MBL2 . . . , via source selection transistors SS03, SS13, SS23 . . . , respectively. The ON-resistance of the source selection transistors SS03, SS13, SS23 . . . is smaller than that of the memory cells M0, M1, M2 . . . Two sub bit lines SBL0 and SBL1 are connected to the main bit line MBL0 via source selection transistors SS02 and SS03, respectively. The segments 10, 11, 12 . . . have source selection lines SS03, SS13, SS23 . . . , respectively. Only one of these source selection lines SS03, SS13, SS23 . . . is selected from the memory matrix.

The sub power source lines SVL0, SVL1, SVL2, SVL3 are connected to a common power source line PV1 via drain selection transistors DS00, DS01, DS02, and DS03, respectively. Since there are four drain selection lines DS0, DS1, DS2, and DS3, it is possible to control so that four predetermined sub power lines out of SVL0, SVL1, SVL2, SVL3 . . . will be connected to the common power source line PV1. In other words, the sub power source lines SVL(4*i*), SVL(4*i*+1), SVL(4*i*+2), and SVL(4*i*+3) (where i=0, 1, 2) are connected to the common power source line PV1 by the drain transistors DSi0, DSi1, DSi2, and DSi3, which are selected by the drain selection lines DS0, DS1, DS2, and DS3, respectively. The power source line PV1 for the segments 10, 11, 12, (and the drain selection lines DS0, DS1, DS2, and DS3 are commonly connected.

In the present embodiment, two sense amplifiers A0 and A1 are connected to one memory matrix. Current detection type sense amplifiers, which detect a current that flows into the sense amplifiers, are used in the present embodiment. However, voltage detection type sense amplifiers may be used instead. The main bit lines MBL0, MBL1, MBL2 . . . are connected to the two sense amplifiers A0 and A1 via a multiplexer 100 that is selected by column selection signals C0, C1, C2 . . . The multiplexer 100 is composed of multiple transfer transistors Tr0, Tr1, Tr2 . . . The transfer transistors Tr0, Tr1, Tr2 . . . connect the main bit lines MBL0, MBL1, MBL2 . . . to the sense amplifiers A0 and A1. The ON-resistance of the transfer transistors Tr0, Tr1, Tr2 . . . are made smaller than those of the memory cell transistors M0, M1, M2, M3 . . . When the column selection signal C1 is selected as shown in FIG. 1, the main bit lines MBL1 and MBL2 are connected to the sense amplifiers A0 and A1, respectively. Similarly, when the column selection signal Cj (j is an integer) is selected, the main bit lines MBLj and MBL(j+1) are connected to the sense amplifiers A0 and A1, respectively.

Next, the method of operation of the above-described non-volatile semiconductor storage apparatus will be explained. First, one of the column selection lines C0, C1, C2 . . . is selected, and adjacent two main bit lines out of MBL0, MBL1, MBL2 . . . are connected to the sense amplifiers A0 and A1, respectively. Of pairs of source selection lines SS0 and SS1, SS2 and SS3, SS4 and SS5 . . . that are installed in the segments 10, 11, 12 . . . , respectively, only one source selection line in the memory matrix becomes an H-level signal line. If SS2 has become an H-level signal line, it means that the segment having the source selection line SS2 has been selected. One of the sub bit lines SBL0 and SBL1, one of the sub bit lines SBL2 and SBL3 . . . within the selected segment are connected to the main bit lines MBL0, MBL1, MBL2 . . . , respectively. One of the word lines WL0, WL1, WL2 . . . within the selected segment (one of 10, 11, 12 . . . ) becomes an H-level signal line, and one row of memory cells is selected. A drain selection line is selected so that two sub power source lines adjacent to the exterior sides of the two selected sub bit lines will be connected to the common power source line PV1. In this way, of the memory cells of the selected row, the two memory cells located between the two selected sub bit lines and the two sub power source lines located on both exterior sides of the two selected sub bit lines are connected to the sense amplifiers A0 and A1, respectively.

Figure 2:
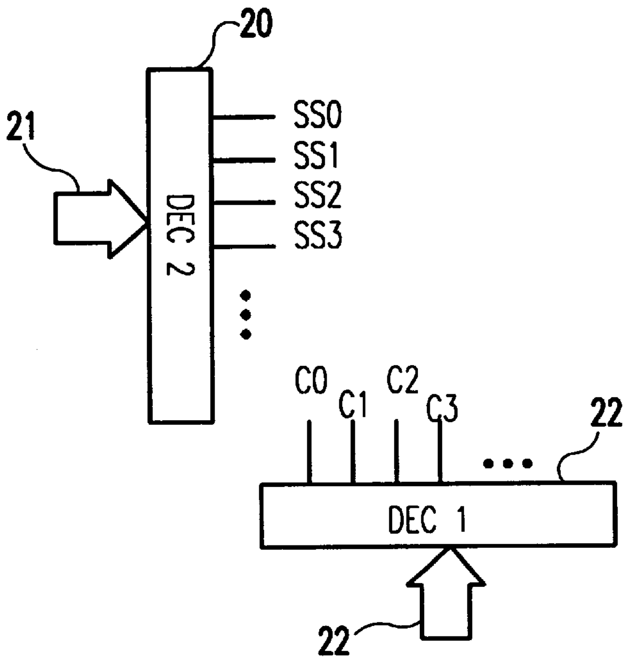
FIG. 2 is a block diagram showing a decoder which generates a source selection line signal and a column selection signal.

FIG. 2 is a block diagram showing a decoder which generates a source selection line signal and a column selection signal. The source selection decoder 20 receives a source selection line address signal 21 and selects one of the source selection lines SS0, SS1, SS2 . . . (supplies an H-level signal). The column selection decoder 22 receives a column selection address signal 23 and activates one of the column selection signals C0, C1, C2 . . . to an H-level.

Figure 3:
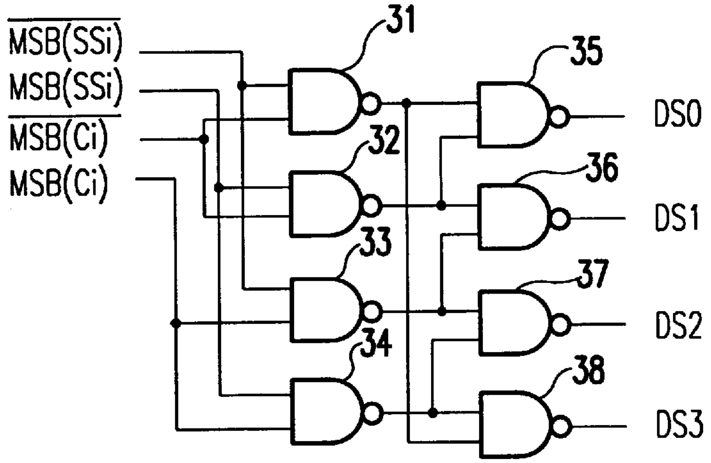
FIG. 3 is a circuit diagram of the drain selection line driving circuit.

FIG. 3 is a circuit diagram of the drain selection line driving circuit. The signal MSB(SSi) shown in FIG. 3 is the least significant address signal of the source selection line address signal 21 shown in FIG. 2. This least significant address signal MSB(SSi) switches source selection lines (for example SS2 and SS3) within the same segment (for example 11). Moreover, the signal MSB(Ci) is the least significant address signal of the column selection signal 23.

As shown in FIG. 3, the drain selection line driving circuit is composed of eight NAND gates. The signal MSB(SSi) is input to one input terminal of the second NAND gate 32 and to one input terminal of the fourth NAND gate 34. The inverted signal MSB(SSi)/ of the signal MSB(SSi) is input to one input terminal of the first NAND gate 31 and to one input terminal of the third NAND gate 33. The signal MSB(Ci) is input to the other input terminal of the third NAND gate 33 and to the other input terminal of the fourth NAND gate 34. The inverted signal MSB(Ci)/ of the signal MSB(Ci) is input to the other input terminal of the first NAND gate 31 and to the other input terminal of the second NAND gate 32.

The output terminal of the first NAND gate 31 is connected to one input terminal of the fifth NAND gate 35 and to one input terminal of the eighth NAND gate 38. The output terminal of the second NAND gate 32 is connected to the other input terminal of the fifth NAND gate 35 and to one input terminal of the sixth NAND gate 36. The output terminal of the third NAND gate 33 is connected to the other input terminal of the sixth NAND gate 36 and to one input terminal of the seventh NAND gate 37. The output terminal of the fourth NAND gate 34 is connected to the other input terminal of the seventh NAND gate 37 and to the other input terminal of the eighth NAND gate 38.

The output terminals of the fifth NAND gate 35 through eighth NAND gate 38 output drain selection signals DS0 through DS3, respectively.

Table 1 is a logic table of the drain selection line driving circuit shown in FIG. 3.

TABLE 1

| MSB(SSi) | MSB(Ci) | DS0 | DS1 | DS2 | DS3 |
|---|---|---|---|---|---|
| L | L | H | L | L | H |
| H | L | H | H | L | L |
| L | H | L | H | H | L |
| H | H | L | L | H | H |

As this table shows, two successive drain selection lines are selected from the four drain selection lines DS0, DS1, DS2, and DS3. As a result of this selection, the sub power source lines positioned on both exterior sides of the selected sub bit lines are selected.

In order to explain the operation of the non-volatile semiconductor storage apparatus of this embodiment in a comprehensive manner, an exemplary case will be explained in which the memory cells M6 and M11 of the segment 11 shown in FIG. 1 are selected.

First, when the column selection line C1 is selected, the sense amplifiers A0 and A1 are connected to the main bit lines MBL1 and MBL2, respectively. When an H-level signal is supplied to the source selection line SS3, the sub bit lines SBL3 and SBL5 are selected and are connected to the main bit lines MBL1 and MBL2, respectively. In this case, the sub bit lines SBL1, SBL7 . . . are also selected. However, the corresponding main bit lines MBL0, MBL2 . . . are not selected. Therefore practically, these sub bit lines SBL1, SBL7 . . . are not selected.

Since the column selection line C1 and the source selection line SS1 are selected, the drain selection line driving circuit shown in FIG. 3 selects the drain selection lines DS2 and DS3. As a result, the sub power source lines SVL3 and SVL6 are connected to the power source line PV1. In this case, the sub power source lines SVL2 and SVL7 are also selected. After this, by selecting the word line WL1, the memory cells M6 and M11 are selected.

Figure 4:
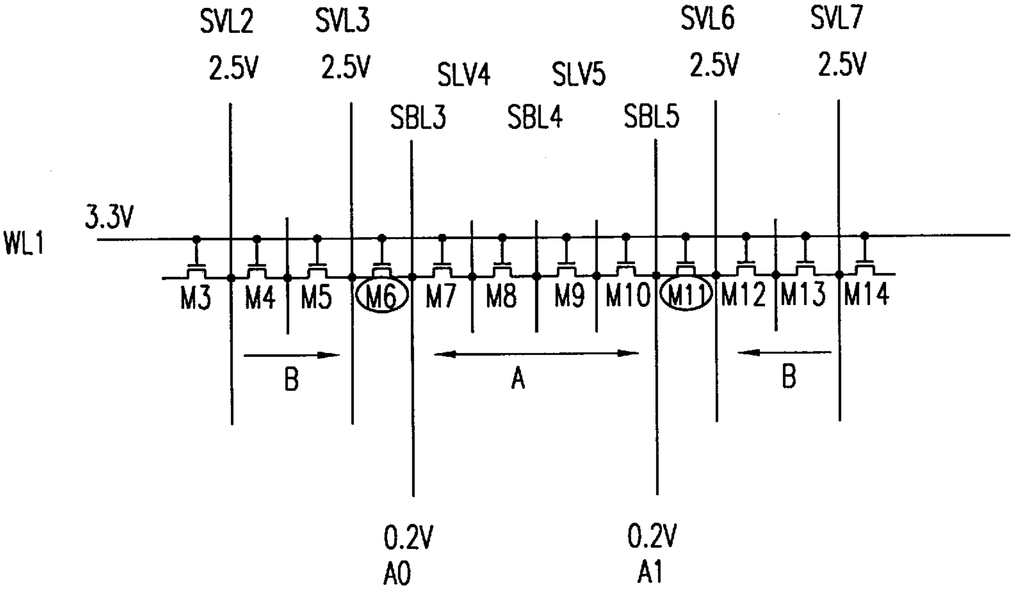
FIG. 4 shows voltages applied to sub power source lines and sub bit lines.

FIG. 4 shows voltages applied to sub power source lines and sub bit lines in the above-described example.

The sense amplifiers A0 and A1 used in this embodiment are low voltage bias type sense amplifiers. These sense amplifiers A0 and A1 apply a low voltage of about 0.2 V to the main bit lines MBL1 and MBL2 to detect currents that flow into the sense amplifiers A0 and A1 from memory cells. Therefore, the source voltages of the selected sub bit lines SBL3 and SBL5 and the source voltages of the selected selection memory cells M6 and M11 also become about 0.2 V. A power source voltage of 3.3 V is applied to the common power source line PV1. Since the drain selection transistors DS02, DS03, DS12, and DS13 are N-type MOS transistors, a voltage of about 2.5 V, which has been obtained as a result of voltage drop by the threshold voltages (about 0.8 V) of these transistors, is applied to the selected sub bit lines SBL3 and SBL6 and sub power source lines SVL2 and SVL7. Therefore, the drain voltage of the selected memory cell is also about 2.5 V.

As shown in FIG. 4, two parasitic current paths A and B exist in the above-described state of selection. When data of the same type is stored in the selected memories M6 and M11, that is, when both the memory cells M6 and M11 store data that produces an ON-state or OFF-state, both ends of the parasitic current path A have the same electric potential. Therefore, a parasitic current iA is not generated.

When one of the memory cells M6 and M11 stores data that produces an ON-state and the other stores data that produces an OFF-state, a voltage difference ΔV is generated between both ends of the parasitic current path A. As a result, a parasitic current iA is generated. If one of the unselected memory cells M7 through M10 installed between the selected memory cells M6 and M11 stores data that produces an OFF-state, the parasitic current path A is shut off and thus the parasitic current iA is not generated. In other words, the parasitic current iA is generated depending on the type of the stored data. Here, the worst case in which the parasitic current iA is generated is considered. The parasitic current iA can be expressed approximately as follows.

$$iA<\Delta V/4R=\Delta i(r/4R) \quad (1)$$

where

ΔV: voltage difference between source terminals of M6 and M11

Δi: maximum current difference between selected memory cells M6 and M11 r: resistance between sense amplifiers A0 and A1 and source terminals of selected memory cells M6 and M11, respectively R: minimum value of the resistance of memory cells M7 through M10.

Equation (1) is provided under the assumption that all the memory cells M7 through M10 hold data that produces an ON-state. If the resistance r between the sense amplifier and the source terminal of each of the selected memory cells M6 and M11 is made about ⅙ of the minimum value r of the resistance of the memory cells M7 through M10 in accordance with equation (1), the parasitic current iA becomes below 1/24 of the maximum value Δi of the current difference between the selected memory cells M6 and M11, which is a negligible value. In order to sufficiently reduce the resistance between the sense amplifiers A0 and A1 and the selected memory cells M6 and M11, respectively, a metal material is used for the main bit lines and sub bit lines. Furthermore, the ON-resistance of the source selection transistors SS03, SS13, SS23 . . . and transfer transistors Tr0, Tr1, Tr2 . . . are made smaller than the ON-resistance of the memory cells M1, M2, M3 . . . As a result of this structure, the resistance r between the sense amplifiers A0 and A1 and the selected memory cells M6 and M11 becomes much smaller than the resistance 4R of the serially connected memory cells M7 through M10.

When the memory cell M6 or M11 holds data that produces an ON-state, a current flows into the memory cell M6 or M11, and the voltage level of the sub power source line SVL3 or SVL6 drops. If both the memory cells M4 and M5 or both the memory cells M12 and M13 hold data that produces an ON-state, a voltage difference is generated between both ends of the parasitic path B, that is, between the sub power source line SVL2 and SVL3 or between the sub power source line SVL7 and SVL6. As a result, a parasitic current iB is generated. However, the voltage between the source and gate of the memory cells M4 and M5 or M12 and M13 through which the parasitic current iB flows is much smaller than the corresponding voltage of the memory cells M6 through M10 that are located between the memory cells M4 and M5 or M12 and M13. Therefore, the parasitic current iB that is actually generated is negligibly small. If one of the memory cell pair M4 and M5 and the memory cell pair M12 and M13 holds data that produces an OFF-state, the parasitic current iB does not flow. Moreover, if a P-type MOS transistor is used for each of the drain selection transistors, the voltage levels of the sub power source lines SVL2, SVL3, SVL6, and SVL7 become close to the level of the power source voltage. As a result, the memory cell pair M4 and M5 or the memory cell pair M12 and M13 is put into a cut-off state, and the parasitic current iB is not generated.

Thus, according to the non-volatile semiconductor storage apparatus of the present embodiment, the parasitic current iB that is actually generated is negligibly small.

When the column address is changed in the non-volatile semiconductor storage apparatus, the electric potentials of the bit lines and power source lines, respectively, must be lowered by discharging. In the above-described example, the sub-bit lines SBL4 and the sub power source lines SVL4 and SVL5 must be discharged from about 2.5 V to about 0.2 V via memory cells when the column address is changed. Since these sub bit line and sub power source lines have small capacitance, discharging via memory cells takes time but not to the extent that affects the access operation. The sub bit lines SBL3 and SBL5 are connected to the main bit lines MBL1 and MBL2, respectively. Since the main bit lines MBL1 and MBL2 and the sub bit lines SBL3 and SBL5 connected to these main bit lines are discharged via the sense amplifiers A0 and A1, the discharge time is short. Therefore, a high-speed access can be achieved.

In addition, no electric separation means for avoiding a parasitic current is installed on the column lines of the non-volatile semiconductor storage apparatus of the present embodiment. Therefore, large-capacitance non-volatile semiconductor storage apparatus can be realized without increasing the size of the memory matrix.

Figure 5:
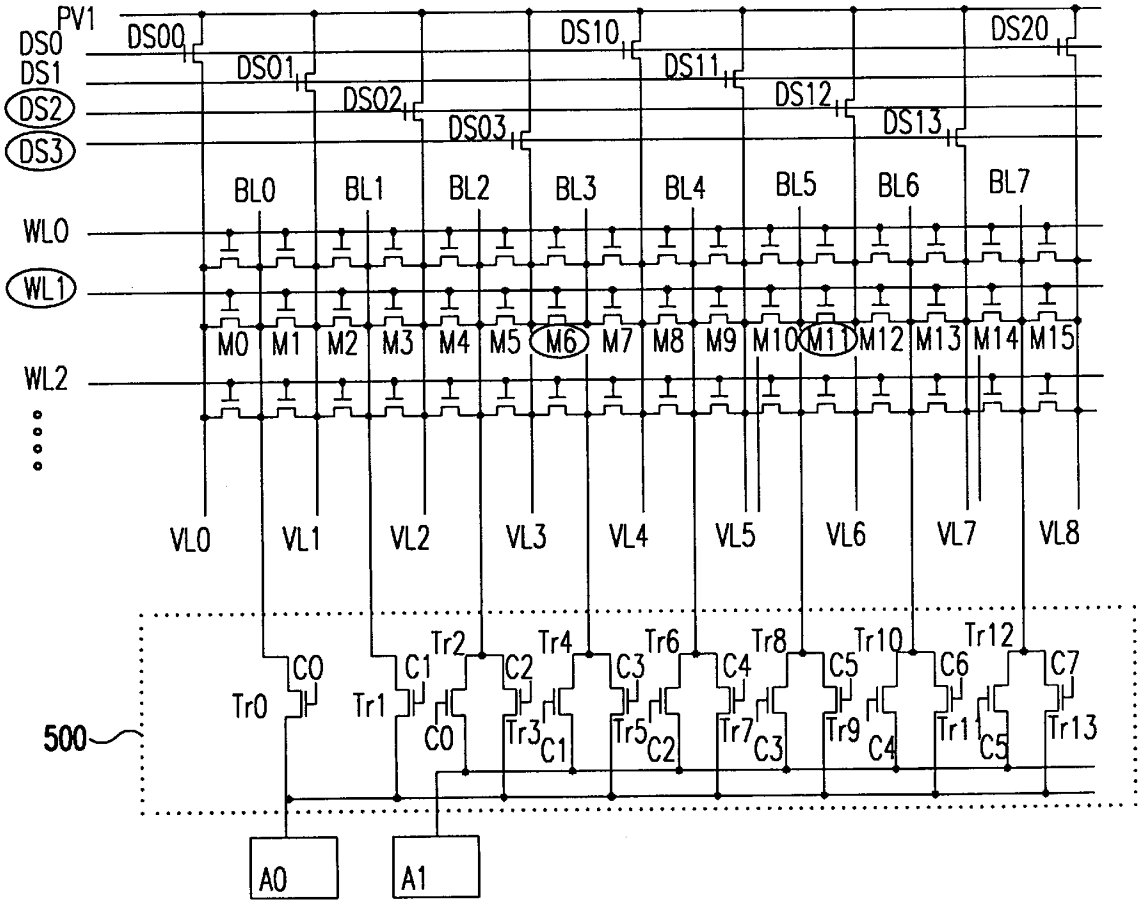
FIG. 5 is a key component circuit diagram showing the second embodiment of the present invention.

FIG. 5 is a key component circuit diagram showing the second embodiment of the present invention. In the first embodiment, the main bit lines and sub bit lines and the like are realized with two-layer wiring. However, in the second embodiment, the bit lines and the like are realized with single-layer wiring. In FIG. 5, the same reference codes are used for the same components that are already used in FIG. 1. Such components are not explained here.

The non-volatile semiconductor storage apparatus of the second embodiment has the same drain selection lines DS0 through DS3, transistors DS00, DS01, DS02 . . . , word lines WL0, WL1, WL2 . . . , and memory cells M0, M1, M2 . . . as the non-volatile semiconductor storage apparatus of the first embodiment. In the second embodiment, the column lines are constituted of power lines VL0, VL1, VL2 . . . and bit lines BL0, BL1, BL2 . . . , which are installed alternately. Source selection lines SS0, SS1, SS2 . . . , and transistors SS02, SS03, SS12 . . . are not installed in the second embodiment as in the first embodiment. Therefore, the image of a memory array made of several segments does not exist in the second embodiment.

When one of the column selection signals is selected, the multiplexer 500 selects two bit lines between which one bit line exists (for example, when the column selection signal C0 is input to the multiplexer 500, the bit lines BL0 and BL2 are selected). These bit lines are then connected to the sense amplifiers A0 and A1, respectively. The power source lines VL0, VL1, VL2 . . . are connected to the common power source line PV1 via drain selection transistors DS00, DS01, DS02 . . . , respectively. The drain selection transistors DS00, DS01, and DS02 are connected to the same drain selection line DS0. The drain selection transistors DS01, DS11 are connected to the same drain selection line DS1. The drain selection transistors DS02 and DS12 are connected to the same drain selection line DS2. The drain selection transistors DS03 and DS13 are connected to the same drain selection line DS3. Based on the logic table shown in Table 2, two of the drain selection lines DS0, DS1, DS2, and DS3 are selected. Here, MSB(Ci) shown in Table 2 represents the least significant address signal of the address input to the decoder of the column selection signal, and 2ndSB(Ci) represents the second least significant address signal of the address input to the decoder of the column selection signal.

TABLE 2

| MSB(Ci) | 2ndSB(Ci) | DS0 | DS1 | DS2 | DS3 |
|---|---|---|---|---|---|
| L | L | H | L | L | H |
| H | L | H | H | L | L |
| L | H | L | H | H | L |
| H | H | L | L | H | H |

As this table shows, the drain selection lines DS0, DS1, DS2, and DS3 can be driven using the same circuit as the drain selection driving circuit shown in FIG. 3. However, the signals MSB(SSi) and MSB(SSi)/ in FIG. 3 must be changed to the signals MSB(Ci) and MSB(Ci)/, and the signals MSB(Ci) and MSB(Ci)/ in FIG. 3 must be changed to the signals 2ndSB(Ci) and 2ndSB(Ci)/. All the unselected power lines and bit lines are put into a floating state.

The operation of the nonvolatile semiconductor storage apparatus of this embodiment will now be explained. Specifically, the exemplary case in which the memory cells M6 and M11 are selected will be explained.

First, by selecting the column selection signal C3, the sense amplifiers A0 and A1 are connected to the bit lines BL3 and BL5, respectively. By having selected the column selection signal C3, both the signals MSB(Ci) and 2ndSB (Ci) become H-level signals (since the column selection signal C3 is the fourth signal, the least significant address and second least significant address of the column selection signal become an H-level). Therefore, as shown in the logic table of Table 2, the drain selection lines DS2 and DS3 are selected. As a result, the power source lines VL3 and VL6 are connected to the power source line PV1. In this case, the power source lines VL2 and VL7 are also selected. After this, by selecting the word line WL1, the memory cells M6 and M11 are selected.

The state of the parasitic current in the above-described selection state is identical to that in the first embodiment. Hence, it will not be explained here.

Figure 6:
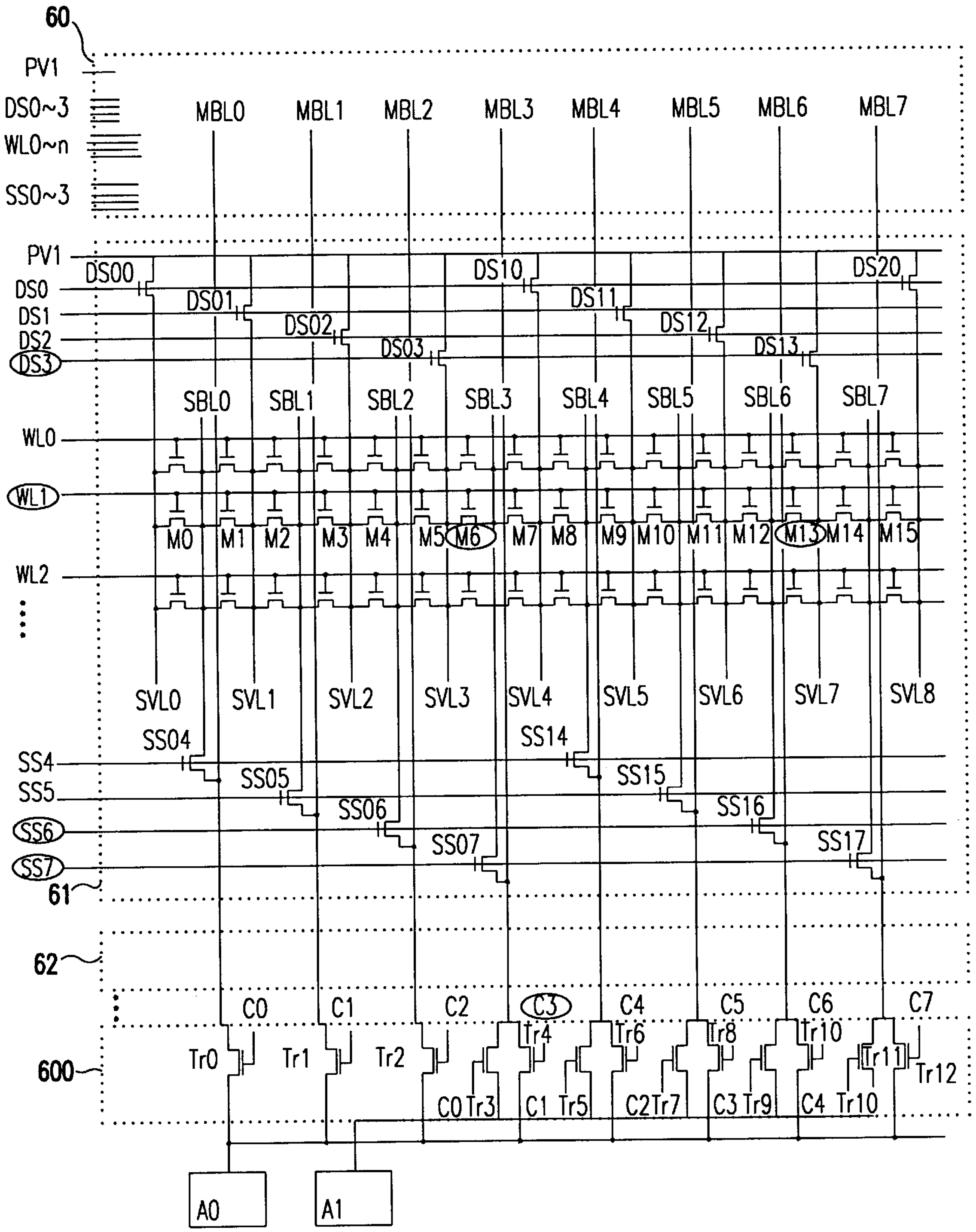
FIG. 6 is a partial circuit diagram showing a non-volatile semiconductor storage apparatus according to the third embodiment of the present invention.

FIG. 6 is a partial circuit diagram showing a non-volatile semiconductor storage apparatus according to the third embodiment of the present invention. As shown in FIG. 1, in the first embodiment, four unselected memory cells exist between the selected memory cells connected to the sense amplifiers A0 and A1. On the other hand in the third embodiment, six unselected memory cells exist between the selected memory cells connected to the sense amplifiers A0 and A1.

In what follows, the configuration of the nonvolatile semiconductor storage apparatus of the third embodiment will be explained.

The nonvolatile semiconductor storage apparatus of the third embodiment has the same drain selection lines DS0 through DS3, transistors DS00, DS01, DS02 . . . , sub power selection lines SVL0, SVL1, SVL2 . . . , sub bit lines SBL0, SBL1, SBL2 . . . , word lines WL0, WL1, WL2 . . . , and memory cells M0, M1, M2 . . . as the nonvolatile semiconductor storage apparatus of the first embodiment. In the third embodiment, the main bit lines MBL0, MBL1, MBL2 . . . are installed corresponding to the sub bit lines SVL0, SVL1, SVL2 . . . , respectively, in 1-to-1 correspondence.

The source selection lines SS0, SS1, SS2 . . . are installed in the segments 50, 51, 52 . . . such that each segment contains four source selection lines. As a result, the gates of the source selection transistors SS04 and SS14 are connected to the source selection line SS4, the gates of the source selection transistors SS05 and SS15 are connected to the source selection line SS5, the gates of the source selection transistors SS06 and SS16 are connected to the source selection line SS6, and the gates of the source selection transistors SS07 and SS17 are connected to the source selection line SS7. The main bit lines MBL0 through MBL7 are connected to the sub power source lines SVL0 through SVL8 via source selection transistors SS04 through SS07 and SS14 through SS17. The main bit lines MBL0 through MBL7 are also connected to the multiplexer 600. When the multiplexer 600 receives column selection signals C0, C1, C2 . . . , the multiplexer 600 opens two main bit lines and connect the two main bit lines to the sense amplifiers A0 and A1, respectively.

Figure 7:
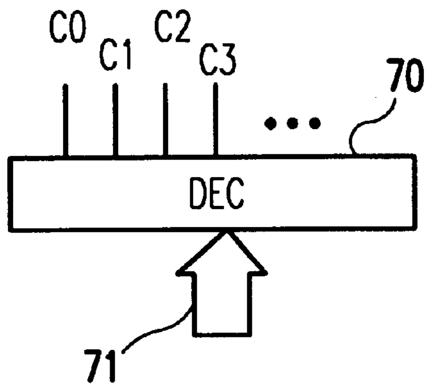
FIG. 7 is a block diagram showing a decoder which generates a column selection signal used in the non-volatile semiconductor storage apparatus according to the third embodiment of the present invention.

FIG. 7 is a block diagram showing a decoder which generates a column selection signal used in the non-volatile semiconductor storage apparatus according to the third embodiment of the present invention. The column selection decoder 70 receives a column selection address signal 71 and activates one of the column selection signals C0, C1, C2 . . . to an H-level.

Figure 8:
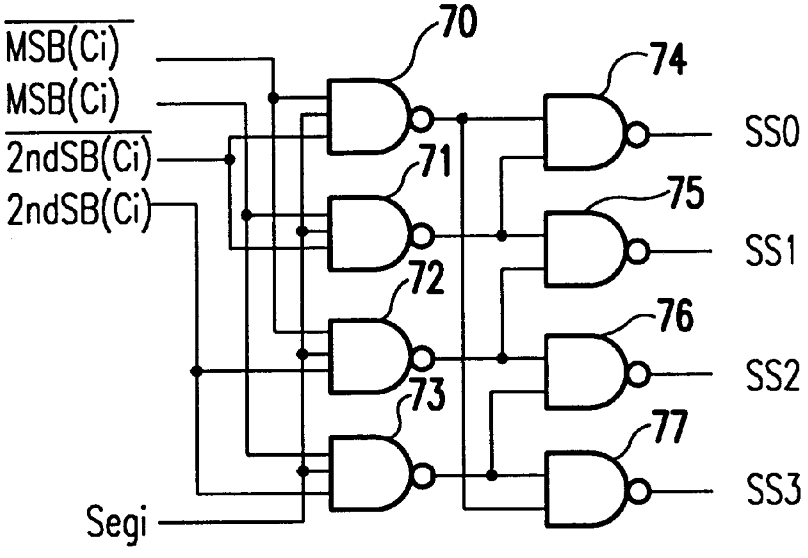
FIG. 8 is a circuit diagram showing a source selection line driving circuit used in the non-volatile semiconductor storage apparatus according to the third embodiment of the present invention.

FIG. 8 is a circuit diagram showing a source selection line driving circuit used in the non-volatile semiconductor storage apparatus according to the third embodiment of the present invention. Though not shown in the drawing, the source selection line driving circuit shown in FIG. 8 is installed on each of the segments 60, 61, 62 . . . .

The signal MSB(Ci) shown in FIG. 8 is the least significant address signal of the column selection address signal 71 shown in FIG. 7. The signal 2ndSB(Ci) is the second least significant address signal of the column selection address signal 71. The signal Segi becomes an H-level signal when the segment is selected and becomes an L-level signal when the segment is not selected.

As shown in FIG. 8, the drain selection line driving circuit is constituted of four 3-input NAND gates 70 through 73 and four 2-input NAND gates 74 through 77. The signal MSB (Ci) is supplied to the first input terminals of the second and fourth 3-input NAND gates 71 and 73, respectively. The inversion signal MSB(Ci)/ of the signal MSB(Ci) is supplied to the first input terminals of the first and third 3-input NAND gates 70 and 72, respectively. The signal Segi is supplied to the second input terminals of the first through fourth 3-input NAND gates 70 through 73, respectively. The signal 2ndSB(Ci) is supplied to the third input terminals of the third and fourth 3-input NAND gates 72 and 73, respectively. The inversion signal 2ndSB(Ci)/ of the signal 2ndSB (Ci) is supplied to the third input terminals of the first and second 3-input NAND gates 70 and 71, respectively.

The output terminal of the first 3-input NAND gate 70 is connected to one input terminal of the first 2-input NAND gate 74 and to one input terminal of the fourth 2-input NAND gate 77. The output terminal of the second 3-input NAND gate 71 is connected to the other input terminal of the first 2-input NAND gate 74 and to one input terminal of the second 2-input NAND gate 75. The output terminal of the third 3-input NAND gate 72 is connected to the other input terminal of the second 2-input NAND gate 75 and to one input terminal of the third 2-input NAND gate 76. The output terminal of the fourth 3-input NAND gate 73 is connected to the other input terminal of the third 2-input NAND gate 76 and to one input terminal of the fourth 2-input NAND gate 77.

Source selection signals SS0 through SS3 are output from the output terminals of the first through fourth 2-input NAND gates 74 through 77, respectively.

Table 3 is a logic table of the source selection line driving circuit shown in FIG. 8

TABLE 3

| MSB(Ci) | 2ndSB(Ci) | SS0 | SS1 | SS2 | SS3 |
|---|---|---|---|---|---|
| L | L | H | L | L | H |
| H | L | H | H | L | L |
| L | H | L | H | H | L |
| H | H | L | L | H | H |

As this table shows, of the four source selection lines SS0 through SS3, two successive ones are selected (considering the case in which SS0 follows SS3).

In the nonvolatile semiconductor storage apparatus of the third embodiment, a drain selection line driving circuit that is different from the one used in the first and second embodiments is used. Table 4 is the logic table of the drain selection line driving circuit according to the third embodiment.

TABLE 4

| MSB(Ci) | 2ndSB(Ci) | DS0 | DS1 | DS2 | DS3 |
|---|---|---|---|---|---|
| L | L | H | L | L | H |
| H | L | H | H | L | L |
| L | H | L | H | H | L |
| H | H | L | L | H | H |

As this table shows, the drain selection line driving circuit drives only one of the drain selection lines DS0 through DS3.

In order to explain the operation of the nonvolatile semiconductor storage apparatus of the present embodiment, the exemplary case in which the memory cells M6 and M13 of the segment 61 are selected will be explained.

First, by selecting the column selection signal C3, the sense amplifiers A0 and A1 are connected to the main bit lines MBL3 and MBL6, respectively. By having selected the column selection signal C3, both the signals MSB(Ci) and 2ndSB(Ci) become H-level signals (since the column selection signal C3 is the fourth signal, the least significant address and second least significant address of the column selection signal become an H-level). Therefore, as shown in Table 4, the drain selection line driving circuit activates the drain selection lines DS3 to an H-level. As a result, the sub power source lines SVL3 and SVL7 (in reality, the sub power source lines SVL11, SVL15, (are also selected) are selected and connected to the power source line PV1. On the other hand, as the logic table of Table 3 shows, the drain selection line driving circuit selects the source selection lines SS6 (this corresponds to SS2 of segment 60) and SS7 (this corresponds to SS3 of segment 60). As a result, the main bit lines MBL3 and MBL7 are connected to the sub bit lines SBL3 and SBL7, respectively. After this, by selecting the word line WL1, the memory cells M6 and M13 are selected.

In the present embodiment, the sub power source line SVL3 and sub bit line SBL3, which are positioned on both sides of the memory cell M6, and the sub power source line SVL7 and sub bit line SBL7, which are positioned on both sides of the memory cell M13, are selected. The sub power lines SVL11, SVL15 . . . , which are selected without any relation to the selected memory cells M6 and M13, are connected via more than eight unselected memory cells. Therefore, the parasitic current can be almost completely ignored. In addition, since six unselected memory cells exist between the selected memory cells M6 and M13, the parasitic current can also be almost completely ignored.

Figure 9:
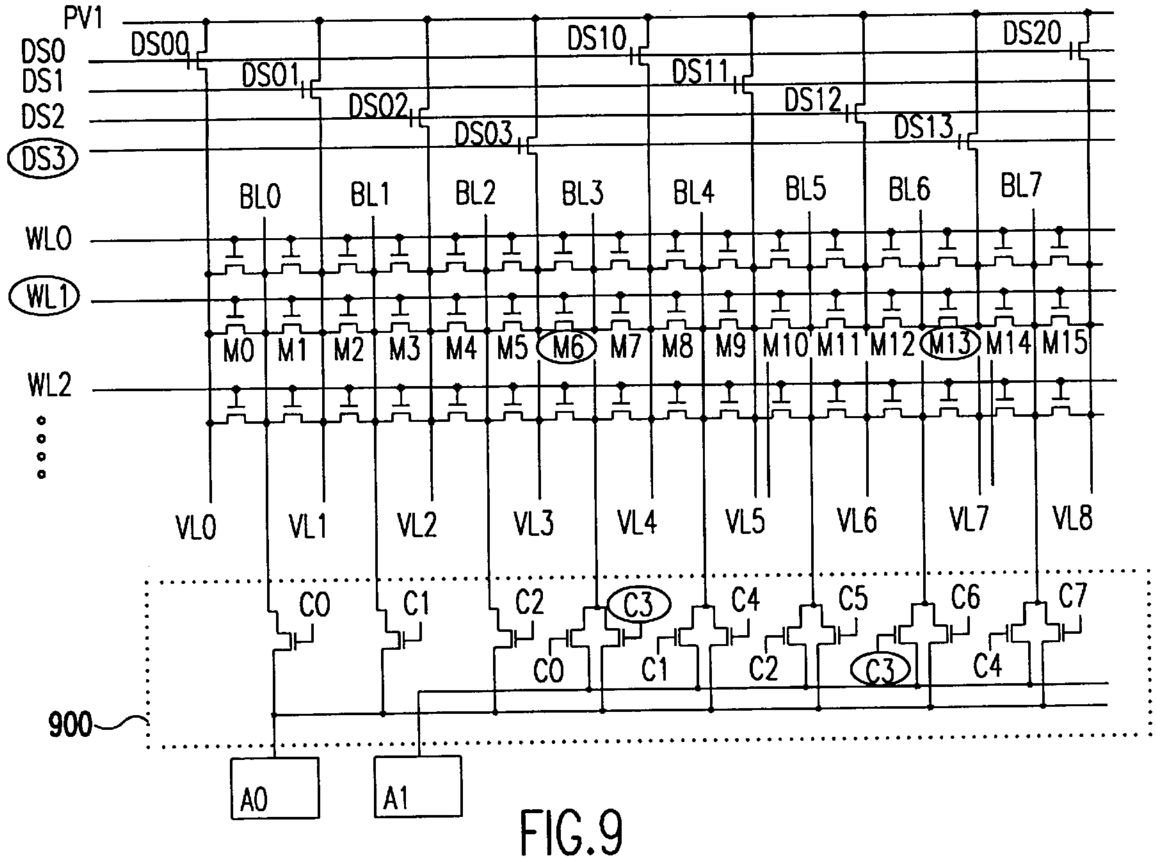
FIG. 9 is a key component circuit diagram showing a non-volatile semiconductor storage apparatus according to the fourth embodiment of the present invention.

FIG. 9 is a key component circuit diagram showing a non-volatile semiconductor storage apparatus according to the fourth embodiment of the present invention.

In the fourth embodiment, six unselected memory cells exist between the selected memory cells selected by the sense amplifiers A0 and A1. Moreover, the non-volatile semiconductor storage apparatus according to the fourth embodiment has a single layer wire structure.

The non-volatile semiconductor storage apparatus according to the fourth embodiment has the same power source line PV1, drain selection transistors DS00, DS01, DS02 . . . , bit lines BL0, BL1, BL2 . . . , word lines WL0, WL1, WL2 . . . , and memory cells M0, M1, M2 . . . as the nonvolatile semiconductor storage apparatus of the second embodiment. Therefore, the image in which the memory array comprises several segments does not exist in the fourth embodiment either.

In the fourth embodiment, when one of the column selection signals C0, C1, C2 . . . is selected, the multiplexer 900 selects two bit lines between which three bit lines exist (for example, if the column selection signal C0 is supplied to the multiplexer 900, the bit lines BL0 and BL3 are selected). These bit lines are then connected to the sense amplifiers A0 and A1. The drain selection lines are driven by a drain selection line driving circuit not shown in the drawing. In this case, the same drain selection line driving circuit as used in the third embodiment is used. Therefore, the drain selection lines are also selected based on Table 4.

In order to explain the operation of the nonvolatile semiconductor storage apparatus of the present embodiment, the exemplary case in which the memory cells M6 and M13 are selected in FIG. 9 will be explained.

First, by selecting the column selection signal C3, the sense amplifiers A0 and A1 are connected to the bit lines BL3 and BL6, respectively. By having selected the column selection signal C3, both the signals MSB(Ci) and 2ndSB (Ci) become H-level signals (since the column selection signal C3 is the fourth signal, the least significant address and second least significant address of the column selection signal become an H-level). Therefore, as shown in Table 4, the drain selection line driving circuit activates the drain selection line DS3 to an H-level. As a result, the power source lines VL3 and VL7 (in reality, the power source lines VL11, VL15 . . . are also selected) are selected and connected to the power source line PV1. After this, by selecting the word line WL1, the memory cells M6 and M13 are selected.

In the present embodiment, the power source line VL3 and bit line BL3, which are positioned on both sides of the memory cell M6, and the power source line VL7 and bit line BL7, which are positioned on both sides of the memory cell M13, are selected. The power source lines VL11, VL15 . . . , which are selected without any relation to the selected memory cells M6 and M13, are connected via more than eight unselected memory cells. Therefore, the parasitic current can be almost completely ignored. In addition, since six unselected memory cells exist between the selected memory cells M6 and M13, the parasitic current can be almost completely ignored.

Figure 10:
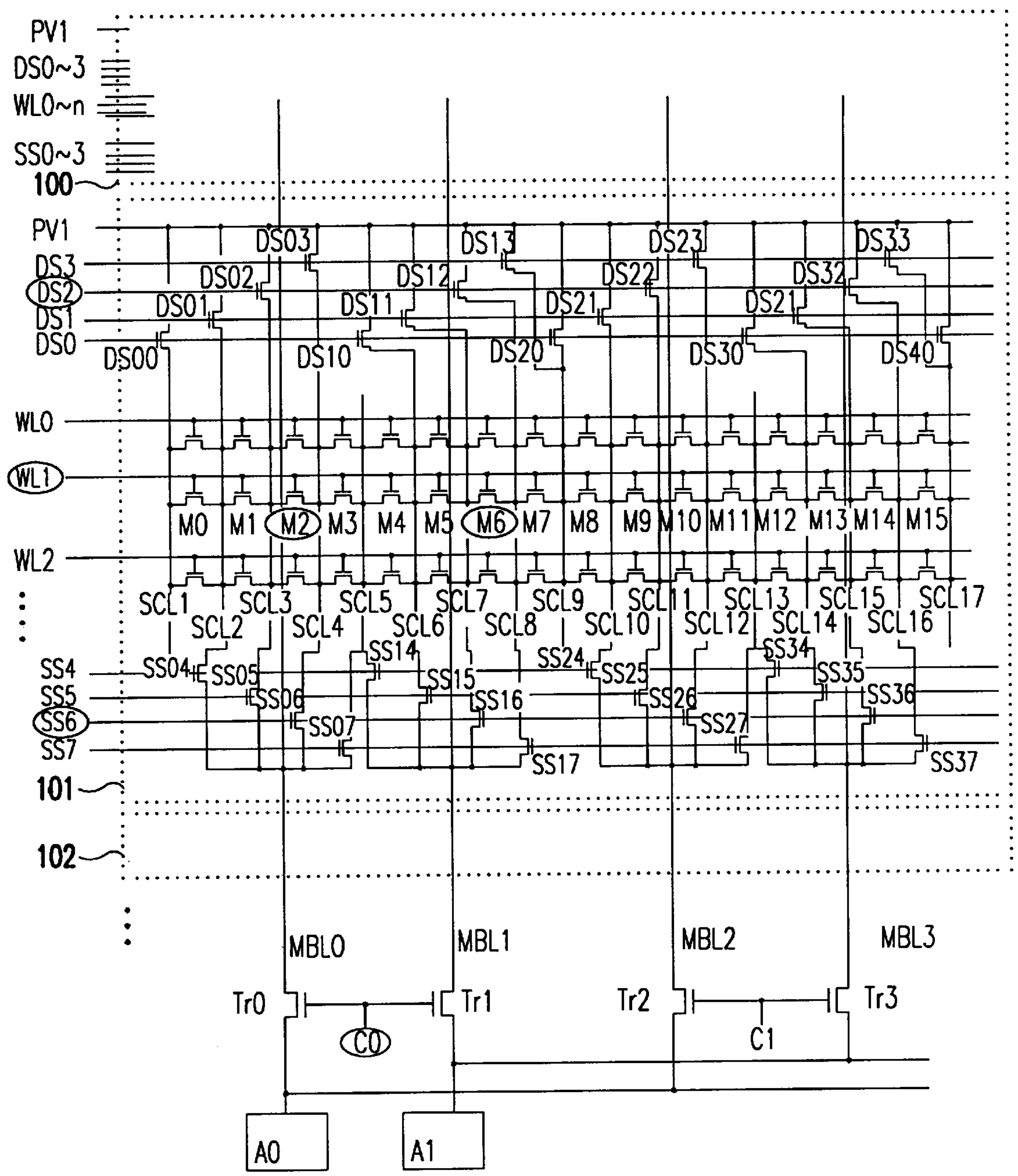
FIG. 10 is a key component circuit diagram showing a non-volatile semiconductor storage apparatus according to the fifth embodiment of the present invention.

FIG. 10 is a key component circuit digram showing the non-volatile semiconductor storage apparatus according to the fifth embodiment of the present invention.

In the fifth embodiment, three unselected memory cells exist between the selected memory cells selected by the sense amplifiers A0 and A1. Moreover, the non-volatile semiconductor storage apparatus according to the fifth embodiment has a two-layer wire structure.

The non-volatile semiconductor storage apparatus according to the fifth embodiment has the same power source line PV1, drain selection transistors DS00, DS01, DS02 . . . , source selection lines SS0, SS1, SS2 . . . , word lines WL0, WL1, WL2 . . . , and memory cells M0, M1, M2 . . . , and source selection transistors SS00, SS01, SS02 . . . as the nonvolatile semiconductor storage apparatus of the third embodiment. The fifth embodiment is characterized by the connection state between the column lines SCL1, SCL2, SCL3 . . . (these correspond to the sub power source lines SVL1, SVL2, SVL3, . . . and sub bit lines SBL1, SBL2, SBL3 . . . , main bit lines MBL0, MBL1, and MBL2 . . . and power source lines PV1. Based on this connection state, one main bit line is installed for four column lines, i.e., SCL1 through SCL4 are connected to MBL0, SCL5 through SCL8 are connected to MBL1, SCL9 through SCL12 are connected to MBL2, SCL13 through SCL16 are connected to MBL3.

Of the column lines, the first four of them SCL1 through SCL4 are connected to the power source line via the drain selection transistors DS00 through DS03, respectively. The fifth column line SCL5 is not connected to the power source line PV1. The subsequent four column lines SCL6 through SCL9 are connected to the power source line PV1 via the drain selection transistors DS10 through DS13, respectively. The column line SCL9 is further connected to the power source line PV1 via the selection transistor DS20. The next three column lines SCL10 through SCL12 are connected to the power source line PV1 via the drain selection transistors DS21 through DS23, respectively. This pattern is then repeated.

The first column line SCL1 is not connected to any main bit line. The column lines SCL2 through SCL5 are connected to the main bit line MBL0 via the source selection transistors SS04 through SS07, respectively. The column line SCL5 is also connected to the main bit line MBL1 via the source selection transistor SS14. The column lines SCL6 through SCL8 are connected to the main bit line MBL1 via the source selection transistors SS15 through SS17, respectively. The column line SCL9 is not connected to any main bit line. This pattern is then repeated.

The sense amplifier A0 is connected to the even numbered main bit lines MBL0, MBL2 . . . via the even numbered transfer transistors Tr0, Tr2 . . . , respectively. The sense amplifier A1 is connected to the odd numbered main bit lines MBL1, MBL3 . . . via the even numbered transfer transistors Tr1, Tr3 . . . , respectively.

The column selection signal C0 is supplied to the gates of the transfer transistors Tr0 and Tr1, respectively. The column selection signal C1 is supplied to the gates of the transfer transistors Tr2 and Tr3, respectively.

Since the source selection line signal is selected without any relation to the column selection lines, the decoders 20 and 21 as shown in FIG. 2 supply source selection line signals and column selection line signs, respectively.

The drain selection signal is generated depending on the source selection line signal. Therefore, the drain selection lines are driven by a drain selection line driving circuit not shown in the drawing. This drain selection line driving circuit supplies signals in accordance with the logic table shown in Table 5.

TABLE 5

| MSB(SSi) | 2ndSB(SSi) | DS0 | DS1 | D52 | DS3 |
|---|---|---|---|---|---|
| L | L | H | L | L | L |
| H | L | L | H | L | L |
| L | H | L | L | H | L |
| H | H | L | L | L | H |

In order to explain the operation of the nonvolatile semiconductor storage apparatus of the present embodiment, the exemplary case in which the memory cells M2 and M6 of the segment 101 are selected in FIG. 10 will be explained.

First, by selecting the column selection signal C0, the sense amplifiers A0 and A1 are connected to the main bit lines MBL0 and MBL1, respectively. The source line signal SS6 is then selected, and the main bit lines MBL0 and MBL1 are connected to the column lines SCL4 and SCL7, respectively. By having selected the column selection signal C0, the signals MSB(SSi) and 2ndSB(SSi) become an L-level signal and an H-level signal, respectively (since the column selection signal C0 is the first signal, the least significant address of the source selection line signal becomes an L-level, and the second least significant address of the source line selection line signal becomes an H-level). Therefore, as shown in Table 5, the drain selection line driving circuit activates the drain selection line DS2 to an H-level. As a result, the column lines SCL3 and SCL8 (in reality, the column lines SCL11, SCL16 . . . are also selected) are selected and connected to the power source line PV1. After this, by selecting the word line WL1, the memory cells M2 and M6 are selected.

In the present embodiment, the column lines SCL4 and SCL7, which are positioned between the memory cells M2 and M6, are connected to the main bit lines MBL0 and MBL1, respectively, and the column lines SCL3 and SCL8, which are positioned to the left and right sides of the memory cells M2 and M6, respectively, are connected to the power source line PV1.

The column lines SCL11, SCL16 . . . , which are selected without any relation to the selected memory cells M2 and M6, are connected from the selected memory cells via three unselected memory cells. Therefore, the parasitic current can be almost completely ignored. In addition, since three unselected memory cells exist between the selected memory cells M2 and M6, the parasitic current can be almost completely ignored.

Figure 11:
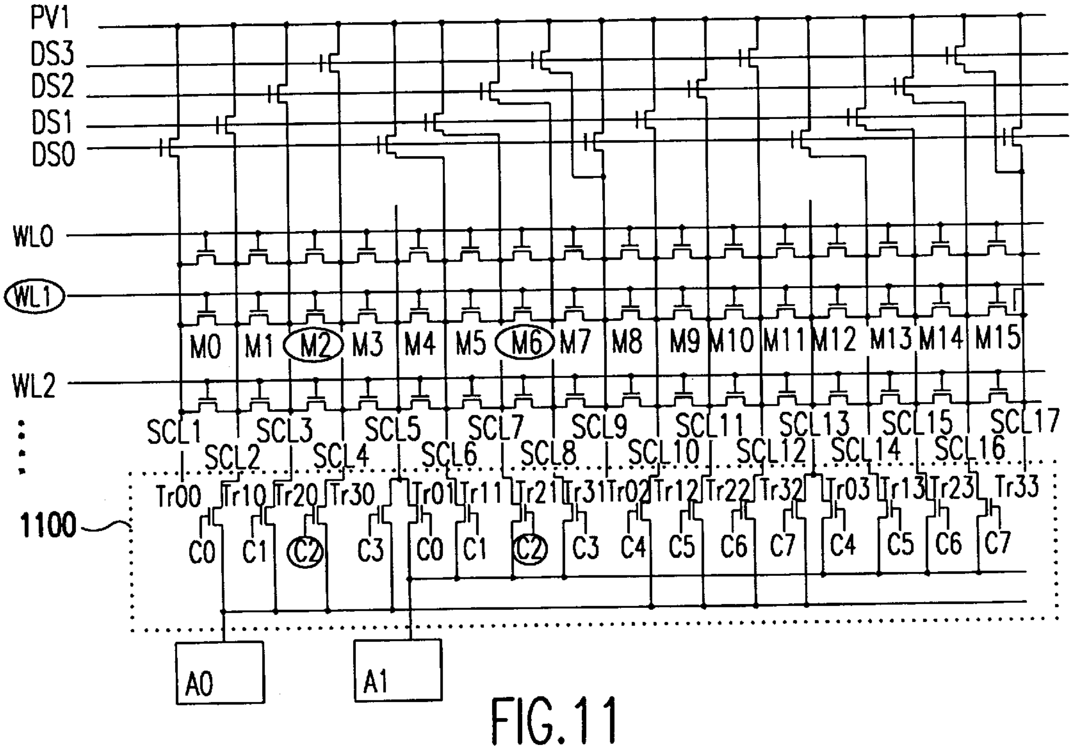
FIG. 11 is a key component circuit diagram showing a non-volatile semiconductor storage apparatus according to the sixth embodiment of the present invention.

FIG. 11 is a key component circuit diagram showing a non-volatile semiconductor storage apparatus according to the sixth embodiment of the present invention.

The non-volatile semiconductor storage apparatus according to the sixth embodiment is constructed by providing a single layer wire structure to the non-volatile semiconductor storage apparatus according to the fifth embodiment.

The non-volatile semiconductor storage apparatus according to the sixth embodiment has the same power source line PV1, drain selection lines DS0 through DS3, word lines WL0, WL1, WL2 . . . , and memory cells M0, M1, M2 . . . , and drain selection transistors DS00, DS01, DS02 . . . as the non-volatile semiconductor storage apparatus of the fifth embodiment. The column lines SCL1, SCL2, SCL3 . . . are connected to the power source line PV1 in the same manner as in the fifth embodiment. However in the sixth embodiment, the column lines SCL2 through SCL5 are connected to the sense amplifier A0 via transfer transistors Tr00 through Tr30, respectively. The column line SCL5 is connected to the sense amplifier A1 also via the transfer transistor Tr01. The column lines SCL6 through SCL8 are connected to the sense amplifier A1 via the transfer transistors Tr11 through TR31, respectively. The column line SCL9 is not connected to any of the sense amplifiers. After this, the above-described procedure is repeated.

Thus, according to the sixth embodiment, source selection lines SS4, SS5, SS6 . . . and transistors SS04, SS05, SS06 . . . as installed in the fifth embodiment are not installed. Therefore, the memory array according to the sixth embodiment is not composed of several segments.

According to the sixth embodiment, when one of the column selection signals C0, C1, C2 . . . is selected, the multiplexer 1100 selects two column lines between which two column lines exist (for example, when the column selection signal C0 is supplied to the multiplexer 1100, column lines SCL2 and SCL5 are selected). These two column lines are then connected to the sense amplifiers A0 and A1, respectively. The drain selection lines are driven by the drain selection line driving circuit without depending on other signals.

In order to explain the operation of the nonvolatile semiconductor storage apparatus of the present embodiment, the exemplary case in which the memory cells M2 and M6 are selected in FIG. 11 will be explained.

First, by selecting the column selection signal C2, the sense amplifiers A0 and A1 are connected to the column lines SCL4 and SCL7, respectively. Next, the drain selection line driving circuit activates the drain selection line DS2 to an H-level. As a result, the column lines SCL3 and SCL8 are selected (in fact, the column lines SCL11, SCL16, (are also selected) and connected to the power source line PV1. After this, by selecting the word line WL1, the memory cells M2 and M6 are selected.

In the present embodiment, the column lines SCL4 and SCL7, which are positioned between the memory cells M2 and M6, are connected to the sense amplifiers A0 and A1, and the column lines SCL3 and SCL8, which are adjacent to the left and right sides of the memory cells M2 and M6, respectively, are connected to the power source line PV1. The parasitic current generated in this case will not be explained here since it is the same as that in the fifth embodiment.

The advantages of the present embodiment will now be explained. When the number of unselected memory cells between the selected memory cells is N, the above-provided equation (1) is expressed by $$iA<\Delta V/4R=\Delta i(r/NR) \quad (2).$$

The parasitic current iA can be made far smaller than the maximum current difference Δi by increasing the number of memory cells N between the selected memory cells. As a result, the resistance between the sense amplifier and the source terminal of each of the selected memory cells can be increased. Thus, the length of each of the column lines can be increased so that the memory matrix needs not be divided into segments.

However, when the number N of memory cells between the selected memory cells is increased, the number of column lines in the floating state between the selected cells also increases. As a result, these column lines take longer time to be discharged when the column lines are switched, resulting in increased length of access time.

The two-layer wire structure is effective for lowering the resistance between the sense amplifier and the selected memory cells. The sheet resistance of the column lines can be decreased layer by layer from the first layer to the upper layers. The size of the cell block can be increased due to the two-layer wire structure, resulting in improved packaging density.

Thus, the increased number of unselected memory cells between the selected memory cells results in lowered cost but increased length of access time. Therefore, the number of unselected memory cells between the selected memory cells needs to be appropriately determined depending on the purpose.

Thus, according to the present invention, the parasitic current can be made as small as possible without using an electric separation means. Moreover, the unselected memory cells on the selected row lines can be prevented from being connected to the selected column lines to the greatest extent.

What is claimed is:

1. A nonvolatile semiconductor memory comprising:

a plurality of memory cell rows having a plurality of memory cell transistors each of which has a gate, a source and a drain, the gates of the memory cell transistors being connected to a word line, sources and drains of the memory cell transistors being serially connected;

a plurality of column lines electrically connecting connection nodes between sources and drains of said memory cell transistors in a column direction;

a power source line supplying a predetermined electrical potential to said column lines;

a first sense amplifier and a second sense amplifier detecting an electrical value appeared on said column lines;

a sense column line selection circuit selectively connecting two column lines connected to one terminal of each of two selected memory cells that are separated by a predetermined number of memory cells on a given memory cell row to said first and second sense amplifiers, respectively; and a power source supply column line selection circuit selectively connecting two column lines connected to another terminal of said two selected memory cells to said power source line, wherein a resistance value of a conductive path from said selected memory cells to said first and second sense amplifiers is smaller than a total of an ON-resistance value of said predetermined number of memory cells.

2. A nonvolatile semiconductor memory as claimed in claim 1, wherein said sense column line selection circuit connects said column lines connected to interior sides of said two selected memory cells to said sense amplifiers, and wherein said power source supply column line selection circuit connects said column lines connected to exterior sides of said two selected memory cells to said sense amplifiers.

3. A nonvolatile semiconductor memory as claimed in claim 1, wherein said power source supply column line selection circuit has:

a plurality of selection transistors for connecting said column lines with said power source line; and a plurality of selection signal lines supplying selection signals for controlling turning on or off of said selection transistors.

4. A nonvolatile semiconductor memory as claimed in claim 1, wherein said sense column line selection circuit has:

a plurality of selection transistors for connecting said column lines with said sense amplifiers; and a plurality of selection signal lines supplying selection signals for controlling turning on or off of said selection transistors.

5. A nonvolatile semiconductor memory as claimed in claim 1, wherein said memory rows are arranged and distributed in a plurality of segments, said nonvolatile semiconductor memory further comprising a plurality of main bit lines, which are located parallel to said column lines, crossing said plurality of segments, and wherein said sense column line selection circuit has:

a sub column line selection circuit formed in each segment, for selectively connecting said main bit lines to said column lines of said each segment; and a main bit line selection circuit selectively connecting said main bit lines to said sense amplifiers.

6. A nonvolatile semiconductor memory as claimed in claim 5, wherein said sub column line selection circuit includes:

a plurality of selection transistors for connecting said column lines to said main bit lines; and a plurality of selection signal lines supplying selection signals for controlling turning on or off of said selection transistors, so that only the sub column line selection circuit formed in selected segment operates.

7. A nonvolatile semiconductor memory as claimed in claim 5, wherein said main bit line selection circuit includes:

a plurality of selection transistors for connecting said main bit lines to said sense amplifiers; and a plurality of selection signal lines supplying selection signals for controlling turning on or off of said selection transistors.

8. A nonvolatile semiconductor storage device comprising:

a memory cell array including, a plurality of word lines formed in a first direction, a plurality of memory cell transistors having a first resistance value during an ON-state, each of memory cell transistors having a gate connected to the word line, a source and a drain connected to those of the next memory cell transistors through connection nodes so as to form memory cell rows in the first direction, and a plurality of column lines each having a second resistance value, each of said column lines connecting connection nodes in a second direction;

a power source supply circuit for selectively supplying an electrical potential to a pair of the column lines connected to sources of two selected memory cells that are separated by a predetermined number of memory cells;

a first sense amplifier and a second sense amplifier detecting an electrical value appeared on said column lines; and a sense column line selection circuit selectively connecting a pair of column lines connected to the drains of the selected memory cells to said first and second sense amplifiers, respectively, said sense column line selection circuit having a third resistance value, wherein a total of the second and third resistance values are smaller than the predetermined number times of the first resistance value.

9. A nonvolatile semiconductor memory according to claim 8, wherein said source supply circuit includes a power source line receiving a power source potential, a plurality of selection transistors connecting between the column lines and the power source line, and a plurality of selection signal lines supplying selection signals to the gates of the selection transistors.

10. A nonvolatile semiconductor memory according to claim 8, wherein said sense column line selection circuit includes a plurality of selection transistors for connecting said column lines with said first and second sense amplifiers and a plurality of selection signal lines supplying selection signals to the gates of the selection transistors.

11. A nonvolatile semiconductor memory according to claim 8, wherein said memory cell array are divided in a plurality of segments.

12. A nonvolatile semiconductor memory according to claim 11, wherein said sense column line selection circuit includes, a plurality of main bit line formed in the second direction, a plurality of first selection transistors for connecting the pair of column lines with a pair of main bit lines, a plurality of second selection transistors for connecting the pair of main bit lines with said first and second sense amplifiers, a segment selection signal line supplying a segment selection signal to the gates of the first selection transistors, and a sense amplifier selection signal line supplying a sense amplifier selection signal to the gates of the second selection transistors.

13. A nonvolatile semiconductor memory according to claim 8 wherein the predetermined number times of the first resistance value is more than eight times of the total of the second and third resistance values.

14. A nonvolatile semiconductor memory according to claim 8, wherein the predetermined number is more than two.

15. A nonvolatile semiconductor storage device comprising:

a memory cell array including, a plurality of word lines formed in a first direction, a plurality of memory cell transistors having a first resistance value during an ON-state, each of memory cell transistors having a gate, a source and a drain, the gates of the memory cell transistors being connected to the word line, sources and drains of the memory cell transistors being serially connected through connection nodes to form memory cell rows formed in the first direction, and a plurality of column lines each having a second resistance value, each of said column lines connecting connection nodes in a second direction;

a power source supply circuit for selectively supplying an electrical potential to said column lines;

a first sense amplifier and a second sense amplifier detecting an electrical value appeared on said column lines; and a sense column line selection circuit selectively connecting two column lines connected to two selected memory cells that are separated by a predetermined number of memory cells on one of the memory cell rows to said first and second sense amplifiers, respectively, said sense column line selection circuit having a third resistance value, wherein a total of the second and third resistance values are smaller than the predetermined number times of the first resistance value.

16. A nonvolatile semiconductor memory according to claim 15, wherein said column lines are made of metal material.

17. A nonvolatile semiconductor memory according to claim 15, wherein the predetermined number is four.

18. A nonvolatile semiconductor memory according to claim 15, wherein the predetermined number is six.

19. A nonvolatile semiconductor memory according to claim 15, wherein the predetermined number is three.

20. A nonvolatile semiconductor memory according to claim 15 wherein the predetermined number times of the first resistance value is more than eight times of the total of the second and third resistance values.

* * * * *